(12) United States Patent
Cohen et al.

(10) Patent No.: US 7,879,697 B2
(45) Date of Patent: Feb. 1, 2011

(54) GROWTH OF LOW DISLOCATION DENSITY GROUP-III NITRIDES AND RELATED THIN-FILM STRUCTURES

(75) Inventors: Philip I. Cohen, Mendota Heights, MN (US); Bentao Cui, Eden Prairie, MN (US)

(73) Assignee: Regents of the University of Minnesota, Saint Paul, MN (US)

( * ) Notice: Subject to any disclaimer, the term of this patent is extended or adjusted under 35 U.S.C. 154(b) by 903 days.

(21) Appl. No.: 11/810,122

(22) Filed: Jun. 4, 2007

(65) Prior Publication Data

US 2010/0090311 A1    Apr. 15, 2010

Related U.S. Application Data

(60) Provisional application No. 60/811,133, filed on Jun. 5, 2006.

(51) Int. Cl.
*H01L 21/20* (2006.01)
*H01L 21/36* (2006.01)

(52) U.S. Cl. .................. 438/478; 438/483; 438/485; 438/489

(58) Field of Classification Search .......... 438/478, 438/479, 481, 489, 485, 483; 257/E21.133, 257/E21.461
See application file for complete search history.

(56) References Cited

U.S. PATENT DOCUMENTS 4,916,088 A    4/1990   Mooney et al.
5,063,166 A    11/1991  Mooney et al.
5,120,393 A    6/1992   Kubo et al.
6,251,835 B1 * 6/2001   Chu et al. ................... 505/411

(Continued)

FOREIGN PATENT DOCUMENTS

EP           0 482 648       4/1992

(Continued)

OTHER PUBLICATIONS

Bentao Cui et al., "Nanostructure formation during ion assisted growth of GaN by molecular beam epitaxy," pp. 1-7, Mar. 4, 2005.

(Continued)

*Primary Examiner*—Shouxiang Hu
(74) *Attorney, Agent, or Firm*—Kagan Binder, PLLC

(57) ABSTRACT

Methods of growing Group-III nitride thin-film structures having reduced dislocation density are provided. Methods in accordance with the present invention comprise growing a Group-III nitride thin-film material while applying an ion flux and preferably while the substrate is stationary or non-rotating substrate. The ion flux is preferably applied as an ion beam at a glancing angle of incidence. Growth under these conditions creates a nanoscale surface corrugation having a characteristic features size, such as can be measured as a wavelength or surface roughness. After the surface corrugation is created, and preferably in the same growth reactor, the substrate is rotated in an ion flux which cause the surface corrugation to be reduced. The result of forming a surface corrugation and then subsequently reducing or removing the surface corrugation is the formation of a nanosculpted region and polished transition region that effectively filter dislocations. Repeating such nanosculpted and polished regions advantageously provide significant reduction in dislocation density in thin-film structures.

14 Claims, 3 Drawing Sheets

U.S. PATENT DOCUMENTS

| | | | |
|---|---|---|---|
| 6,261,931 | B1 | 7/2001 | Keller et al. |
| 6,610,144 | B2 | 8/2003 | Mishra et al. |
| 6,667,184 | B2 | 12/2003 | Motoki et al. |
| 6,784,085 | B2 | 8/2004 | Cuomo et al. |
| 6,849,525 | B2 | 2/2005 | Kim et al. |
| 6,943,128 | B2 | 9/2005 | Chiyo et al. |
| 7,105,865 | B2 | 9/2006 | Nakahata et al. |
| 7,112,830 | B2 | 9/2006 | Munns |
| 7,118,813 | B2 | 10/2006 | Xu et al. |
| 7,154,131 | B2 | 12/2006 | Irikura et al. |
| 2001/0012678 | A1 | 8/2001 | Tanaka et al. |
| 2001/0013313 | A1* | 8/2001 | Droopad et al. ............. 117/200 |
| 2002/0069817 | A1 | 6/2002 | Mishra et al. |
| 2004/0057482 | A1 | 3/2004 | Wang |
| 2005/0103257 | A1 | 5/2005 | Xu et al. |
| 2005/0142391 | A1 | 6/2005 | Dmitriev et al. |
| 2005/0183658 | A1 | 8/2005 | Nakahata et al. |
| 2006/0273343 | A1 | 12/2006 | Nakahata et al. |
| 2006/0278611 | A1* | 12/2006 | Sato et al. ..................... 216/66 |
| 2007/0141814 | A1* | 6/2007 | Leibiger et al. ............. 438/483 |

FOREIGN PATENT DOCUMENTS

| | | |
|---|---|---|
| EP | 1 245 701 | 10/2002 |
| JP | 2001-288000 | 10/2001 |
| JP | 2002-217116 | 8/2002 |
| JP | 2002-289538 | 10/2002 |
| JP | 2002-299249 | 10/2002 |
| JP | 2002-338396 | 11/2002 |
| JP | 2004-099337 | 4/2004 |
| JP | 2004-158850 | 6/2004 |
| JP | 2004-363349 | 12/2004 |
| WO | WO 2004/061909 | 7/2004 |
| WO | WO 2004/112112 | 12/2004 |

OTHER PUBLICATIONS

Bantao Cui et al., Direct measurement of curvature dependent ion etching of GaN, pp. 1-7, Feb. 15, 2005.

Cui, Bentao, "Study of ion beam assisted deposition of low dislocation density GaN thin films using molecular beam epitaxy," Thesis, Oct. 24, 2005, pp. 1-177.

Gibart, Pierre, "Metal organic vapour phase epitaxy of GaN and lateral overgrowth," Rep. Prog. Phys. 67 (2004) pp. 667-715.

Amano et al., "Stress and Defect Control in GaN Using Low Temperature Interlays," Jpn. J. Appl. Phys. vol. 37 (1998) pp. L1540-L1542.

Fang et al., "Reduction of threading dislocations in GaN layers using in situ deposited silicon nitride masks on AlN and GaN nucleation layers," Appl. Phys. (2004) vol. 84, 4, pp. 484-486.

Lee et al., "Reduction of dislocations in GaN epilayers grown on Si(111) substrate using $Si_xN_Y$ inserting layer," Appl. Phys. (2004) vol. 85, 9, pp. 1502-1504.

Tanaka et al., "Anti-Surfactant in III-Nitride Epitaxy Quantum Dot Formation and Dislocation Termination," Jpn. J. Appl. Phys. vol. 39 (2000) pp. L831-L834.

Huang et al., "Defect reduction with quantum dots in GaN grown on sapphire substrates by molecular beam epitaxy," Appl. Phys. Lett.. (2002), vol. 80, 2, pp. 216-218.

Masatomo, et al., "Reduction of defect density in GaN epilayer having buried Ga metal by MOCVD," Journal of Crystal Growth, 237-239 (2002) pp. 1060-1064.

Jeganathan et al., "Reduction of dislocations in GaN epilayers using templated three-dimensional coherent nanoislands," Appl. Phys. Lett. 86, 191908 (2005).

Nitta et al., "Mass Transport of GaN and Reduction of Threading Dislocations," Surface Review and Letters, vol. 7, Nos. 5&6 (2000) pp. 561-564.

Ashby et al., "Low-dislocation-density GaN from a single growth on a textured substrate,"Appl. Phys. Lett. vol. 77, 20 (2000), pp. 3233-3235.

Cui et al., "Nanostructure formation during ion-assisted growth of GaN by molecular beam epitaxy," J. Appl. Phys. 97, (2005), 104313.

Headrick et al., "Ion-assisted nucleation and growth of GaN on sapphire(0001)," Physical Review B, vol. 58, No. 8, (1998), pp. 4818-4824.

DeLuca et al., "Glancing-Angle Ion Enhanced Surface Diffusion on GaAs(001) during Molecular Beam Epitaxy," Phy.s Rev. Ltt. 86, 2, (2001) pp. 260-263.

Bradley et al., "Theory of ripple topography induced by ion bombardment," J. Vac. Sci. Technol.A 6(4) (1988), pp. 2390-2395.

Bradley, R. Mark, "Dynamic Scaling of ion-sputtered rotating surfaces," Phys. Rev., vol. 54, 6, (1996), pp. 6149-6152.

Cui et al., "Direct measurement of curvature dependent ion etching of GaN," J. App. Phys. 98, 083504 (2005).

Hansen et al., "Step Edge Sputtering Yield at Grazing Incidence Ion Bombardment," Phys. Rev. Lett., vol. 92, 24, 246106 (2004).

Narayanan et al., "Gallium nitride epitaxy on (0001) sapphire," Phil. Mag. A, vol. 82, 5, (2002) pp. 885-912.

Held et al., "Structure and composition of GaN(0001) A and B surfaces," J. App. Phy., vol. 85, 11, (1999), pp. 7697-7704.

Held et al., "In Situ Control of GaN Growth by Molecular Beam Epitaxy," J. Electron. Mater., vol. 26, 3, (1997), pp. 272-280.

Morkoc, et al, "Growth and Investigation of GaN/AlN Quantum Dots," Mat. Res. Soc. Symp., vol. 639 (2001), G11.2.1-G11.2.6.

Parkhomovsky et al., "Hexagonal growth spirals on GaN grown by molecular-beam epitaxy: Kinetics versus thermodynamics," App. Phys. Lett., vol. 78, 16, (2001), pp. 2315-2317.

Vosconti et al., "Rapid Delineation of Extended Defects in GaN and a Novel Method for Their Reduction," phys. Stat. Sol. (a) 190, No. 1, (2002), pp. 5-14.

Li et al, "Ion-beam sculpting at nanometre length scales," Nature, vol. 412, (2001), pp. 166-169.

\* cited by examiner

GROWTH OF LOW DISLOCATION DENSITY GROUP-III NITRIDES AND RELATED THIN-FILM STRUCTURES

CROSS-REFERENCE TO RELATED APPLICATION

The present patent application claims priority to U.S. Provisional Application No. 60/811,133, filed Jun. 5, 2006, the entire contents of which are incorporated herein by reference for all purposes.

GOVERNMENT RIGHTS

This invention was made with Government support under Grant No. FA9550-04-C-0051, awarded by the Air Force Office of Scientific Research and under Grant No. DMR-0074675, awarded by the National Science Foundation. The Government has certain rights in this invention.

TECHNICAL FIELD

The present invention is directed to epitaxial growth of Group-III nitrides. More particularly, the present invention is directed to growth of low dislocation density Group-III nitrides such as gallium nitride and related thin-film structures.

BACKGROUND

Group-III nitride materials such as gallium nitride are wide bandgap semiconductors used in the production of electrical and opto-electronic devices such as blue light emitting diodes, lasers, ultraviolet photodetectors, and power transistors. There are currently no cost effective, lattice matched substrates on which these crystalline materials can be epitaxially grown. Common substrates for the growth of these materials include sapphire, silicon, gallium arsenide, and silicon carbide. Each of these materials has significant lattice mismatch with respect to the gallium nitride crystal structure. For example, the lattice mismatch for gallium nitride on sapphire is about 16%, gallium nitride on silicon carbide is about 3.1%, and gallium nitride on silicon is about 17%.

The lattice mismatch between the substrate and the epitaxial overgrown layer results in defects in the periodic crystal structure of the epitaxial layers. The most common defect is called a threading dislocation, which is essentially a misalignment in the lattice of the crystal structure. Dislocation densities above $10^4$ cm$^{-2}$ typically degrade performance of both optical and electronic devices made with such structures by carrier scattering, catalyzing impurity movement, roughening interfaces, and serving as a parasitic defect or recombination site. In order to preserve smooth interfaces and reduce dislocation densities, a variety of mitigation and density reduction approaches have been proposed in the past.

Techniques such as molecular beam epitaxy (MBE) or metal-organic chemical vapor deposition (MOCVD) for the growth of gallium nitride typically produce material with dislocation densities on sapphire or silicon carbide greater than $10^9$ cm$^{-2}$ and on silicon greater than $10^{10}$ cm$^{-2}$, with very thick films having lower densities. High quality commercial templates can currently be obtained with dislocation densities that are about $5\times10^8$ cm$^{-2}$ for 3 μm material and about $5\times10^7$ cm$^{-2}$ for 10 μm material, the latter MOCVD films grown by epitaxial lateral overgrowth. In the most successful methods, threading dislocations are not replicated by employing a lateral growth mode and channels are created so that they can either terminate or turn around.

In the lateral overgrowth approach, the underlying substrate is patterned using a photomask and material is grown in windows opened to the substrate. As the crystal grows, the window tends to overgrow the masked area. In this overgrown area, the threading dislocation density is significantly lower than in the window area (up to 4 orders of magnitude lower). A disadvantage of this technique, however, is that the substrate must be patterned and, in turn, area is sacrificed. Other approaches to reduce dislocation densities in gallium nitride include insertion of low temperature layers, insertion of silicon nitride layers, and insertion of nanostructured layers of quantum dots. These structures provided dislocation densities of $10^7$ cm$^{-2}$ using either multiple layers or thick film growth. In the last case, the nanofeatures are thought to serve as end points for the threading dislocations. In all of these approaches to reduce dislocation densities, however, thick layers are needed, which causes undesirable stress in the layers, many processing steps are needed, and typically several growth reactors are required.

SUMMARY

The present invention thus provides methods for growing low dislocation density Group-Ill nitride materials such as gallium nitride that can be used in thin-film structures. Such low dislocation materials in accordance with the present invention can be formed as thin layers having less stress, with fewer processing steps, and epitaxial growth that can be performed in one growth reactor.

One aspect of the present invention relates to growth methods that use glancing angle ion-beam processing, in conjunction with molecular beam epitaxy growth, to form nanosculpted interfaces that effectively function as dislocation filters. The main advantages of such methods are that lithography or etching or other out-of-vacuum processing steps are unnecessary. Moreover, the chance of foreign materials being introduced during such processing steps is minimized or eliminated. Such methods can be easily repeated and can achieve a high dislocation reduction per filtering step.

Ion beams have previously been applied to thin-film epitaxy to enhance surface diffusion; however it is difficult to obtain a useful growth rate when supplying a large enough flux to have a significant effect. In accordance with the present invention, a glancing incident ion flux is to used to create an instability, resulting in a surface corrugation that balances sputter induced roughening and surface smoothening.

For the growth of gallium nitride, a glancing incident ion flux can also extend the window of smooth, uniform growth to higher gallium fluxes. Because the sputtering yield for small-diameter gallium droplets is larger than that of a flat terrace, the formation of gallium droplets and the consequent non-uniform growth can be avoided. This means that growth can be conducted several hundred degrees below normal growth temperatures where condensation of gallium is otherwise unavoidable.

In another aspect of the present invention, an ion beam is used to first create a nanoscale surface corrugation or ripple by keeping the substrate fixed with respect to the incident ion beam during growth and then to subsequently smoothen the surface by slowly rotating the sample without growth with respect to the incident ion beam. Without rotation, a surface corrugation is created with a wavelength of the order of 100-800 nm, depending on the ion energy and processing time. Some point defects were introduced by the ion beam, as indicated by a small increase in the yellow luminescence and a slight reduction in the electron mobility. Moreover, the ion beam inhibited the formation of gallium droplets, which is believed important because such droplets have been identified as possible centers for dislocation generation.

In another aspect of the present invention a method of making a layered thin-film structure is provided. The method comprises the steps of: a) providing a substrate having a surface; b) epitaxially growing a Group-III nitride material on at least a portion of the surface of the substrate for a growth period while concurrently applying an ion flux at a glancing angle of incidence during at least a portion of the growth period to provide a nanoscale surface corrugation having a feature size; c) after step b) rotationally moving the substrate while applying the ion flux at the glancing angle of incidence to reduce the feature size of the nanoscale surface corrugation thereby forming a transition region; and d) epitaxially growing the Group-III nitride material on at least a portion of the transition region. Methods in accordance with the present invention may also include steps that provide additional nanostructured layers such as those including quantum dots or the like. Such quantum dots can advantageously provide termination of dislocations.

In another aspect of the present invention a method of making a gallium nitride dislocation filtering buffer layer structure is provided. The method comprises the steps of: a) creating a nanoscale surface corrugation having a feature size by applying a glancing angle ion flux while concurrently epitaxially growing gallium nitride; and b) forming a transition region by reducing the feature size of the nanoscale surface corrugation by applying the glancing angle ion flux.

In another aspect of the present invention a gallium nitride based single crystal thin-film structure is provided. The thin-film structure comprises, in the following order: a) a single crystal gallium nitride region; b) an ion flux nanosculpted single crystal gallium nitride region having a dislocation density higher than that of region a); c) an ion flux polished single crystal gallium nitride transition region having a dislocation density less than that of region a); d) a single crystal gallium nitride region having a dislocation density less than about $1\times10^6$ defects per centimeter squared; and e) regions b) and c) provided one or more times in that order. Structures in accordance with the present invention may also comprise additional nanostructured layers such as those that provide quantum dots or the like.

In yet another aspect of the present invention, a gallium nitride substrate is provided. The gallium nitride substrate comprises a gallium nitride region adjacent to at least one dislocation reducing transition region formed by creating a nanoscale surface corrugation with a first glancing angle ion flux treatment followed by smoothing the nanoscale surface corrugation with a second glancing angle ion flux treatment, wherein the transition region comprises a greater gallium concentration than the gallium nitride region and wherein the substrate comprise a dislocation density less than about $1\times10^6$ defects per centimeter squared.

Accordingly, a three-order of magnitude reduction in the dislocation density is provided in gallium nitride thin films grown by molecular beam epitaxy on gallium nitride nanosculpted layers prepared by ion beam assisted molecular beam epitaxy in accordance with the present invention. Using atomic force microscopy on samples etched in KOH or NH3, we find that the dislocation density is reduced to $2\times10^7$ defects per centimeter squared. A dislocation density less than about $1\times10^6$ defects per centimeter squared is believed possible with plural transition regions in accordance with the present invention.

DETAILED DESCRIPTION

The present invention provides methods of growing Group-III nitride thin-film structures having reduced dislocation density. Methods in accordance with the present invention comprise growing a Group-III nitride thin-film material while applying an ion flux and preferably with a stationary (non-rotating substrate). The ion flux is preferably applied as an ion beam at a glancing angle of incidence. Growth under these conditions creates a nanoscale surface corrugation having a characteristic features size, such as can be measured as a wavelength or surface roughness. After the surface corrugation is created, and preferably in the same growth reactor, the substrate is rotated in an ion flux which cause the surface corrugation to be reduced. That is, the feature size of the corrugation is reduced and the surface essentially becomes smoother. Surprisingly, the result of forming a surface corrugation and then subsequently reducing or removing the surface corrugation is the formation of a nanosculpted region and polished transition region that effectively filter dislocations. Repeating such nanosculpted and polished regions advantageously provide significant reduction in dislocation density in thin-film structures.

Figure 1:
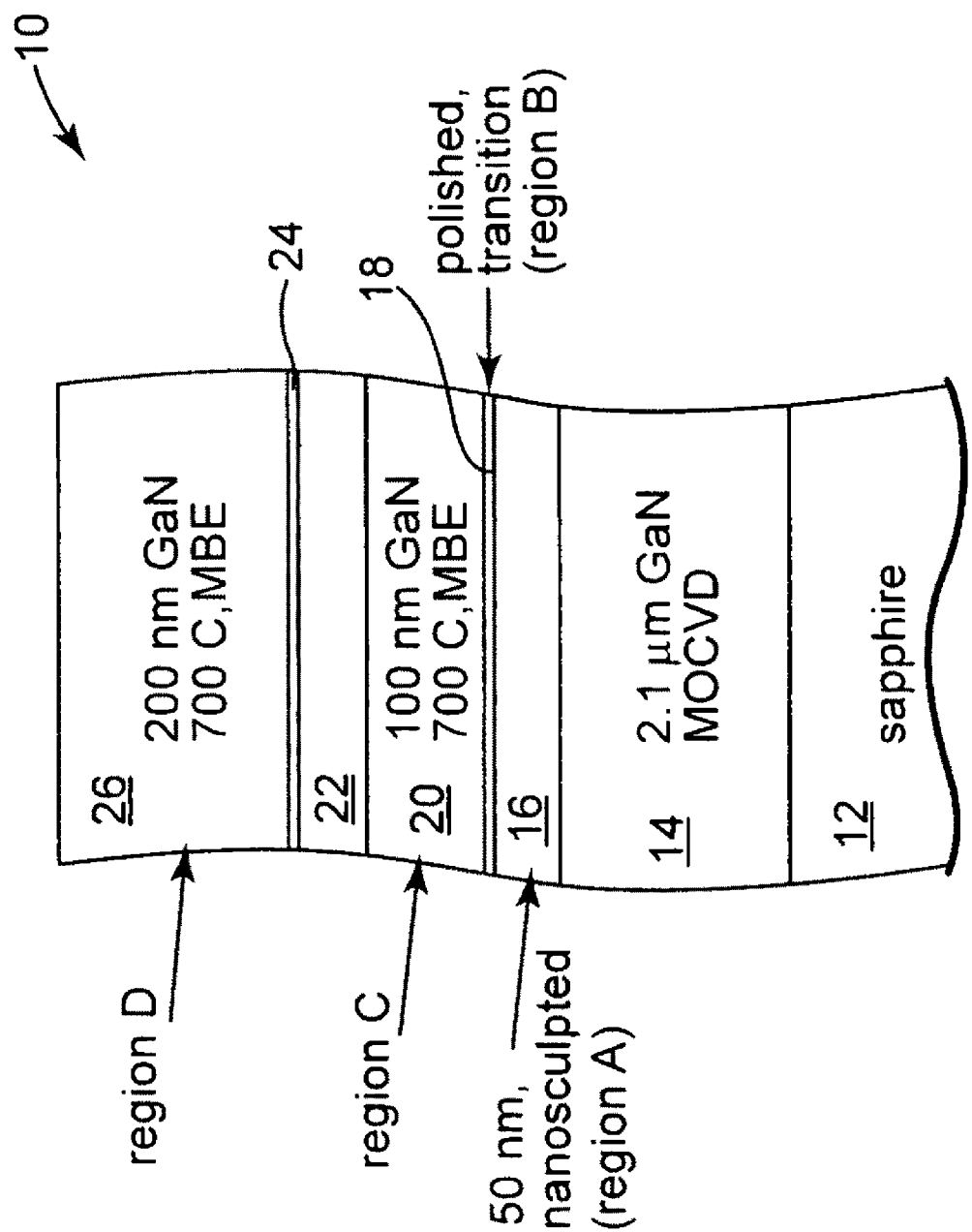
FIG. 1 is a schematic illustration of a thin-film structure in accordance with the present invention comprising a first and second dislocation filtering transition regions each comprising an ion flux nanosculpted region and an ion flux polished region.

In FIG. 1, an exemplary thin-film structure 10 in accordance with the present invention is shown. The structure is described with respect to gallium nitride but any Group-III nitride can be used. Generally, the thin-film structure 10 comprises a substrate 12, gallium nitride base layer 14, first nanosculpted region 16, first transition region 18, first gallium nitride layer 20, second nanosculpted region 22, second transition region 24, and second gallium nitride layer 26. The substrate 12 comprises any substrate with suitable lattice match to the particular Group-III material being grown. For gallium nitride, suitable substrates include sapphire, silicon, silicon carbide, germanium and zinc oxide. The base gallium nitride layer 14 is epitaxially grown by any suitable technique such as molecular beam epitaxy or metal organic chemical vapor deposition and has an initial dislocation density. The thickness of layer 14 as shown is about 2.1 microns but any desired thickness can be used depending on the desired crystal properties and thin film structure desired.

The first nanosculpted region 16 is preferably epitaxially grown by molecular beam epitaxy but any suitable technique can be used. During growth a glancing angle ion beam is applied which causes a surface corrugation to form. Preferably, the substrate is stationary or rotated at a low enough rotation rate for the surface corrugation to form. After the surface corrugation is formed, the growth is stopped and the substrate is rotated at a sufficient rate in the presence of the ion beam to reduce or substantially remove the surface corrugation. The same ion beam can be used as in the step of forming the surface corrugation or different parameters can be used. Rotation in the presence of the ion beam forms the polished transition region 18. First gallium nitride layer 20 is then grown by any desired technique. First gallium nitride 20 accordingly has a reduced dislocation density as compared to the dislocation density of base layer 14.

As shown in FIG. 1, the process is repeated to form second nanosculpted region 22, second transition region 24 and second gallium nitride layer 18. The process can be repeated as many times as desired, wherein each repetition provides further reduction in the dislocation density. It is believed that dislocation densities below $1 \times 10^6$ cm$^{-2}$ can be achieved.

In accordance with the present invention, factors to obtaining dislocation reduction are (1) insertion of nanosculpted layers at low temperature, (2) the choice of the characteristic length scale in the nanosculpted region, (3) the prevention of excessive roughness from forming while the nanosculpted region was prepared, and (4) sufficient surface smoothening in the transition region. The use of the glancing angle ion beam not only forms the nanosculpted region but inhibits the formation of Ga droplets at the low temperatures required for the growth. To test the importance of low temperature growth of the nanosculpted layer, alone, we examined the dislocation density after growth of a dislocation filter on samples like that in FIG. 2 with and without rotation. The result was that for a sample grown with rotation, the dislocation density was not reduced. This means that merely reducing the possibility of dislocation climb for that layer was not a sufficient mechanism to produce the observed results.

Not wishing to be bound to any theory, it is believed that the nanoscale features correspond to a surface with a strain modulation. The dislocations below this layer are forced to the side or to either coalesce into nanopipes or annihilate. The other possibility is that the nanostructure acts as sites to end dislocations, but this would require a defected region to have formed. Currently we favor the former explanation. This method could be a very general approach to filtering dislocations, depending on the role of the glide plane of this wurtzite structure. By applying ion beam technology to epitaxial growth, we have combined a patterning capability with molecular beam epitaxy (MBE) to sculpt GaN nano structures with the capability of ion beams to polish, into an effective dislocation filter for growing of low dislocation density GaN main layer. Another possibility is that dislocation loops could glide out the sides of the nanoscale features that are formed. Or the nanoscale features relieve strain, and the resulting lateral variation in strain focuses the dislocations.

Exemplary methods for forming structures such as shown in FIG. 1 in accordance with the present invention are described below. Experiments were carried out in a modified PHI 400 molecular beam epitaxy (MBE) system. Gallium was provided by a conventional effusion cell. The nitrogen source was an SVTA (of Eden Prairie Minn.) RF plasma source operated at 325 W of forward RF power and a N$_2$ pressure of $8 \times 10^{-6}$ Torr. A broad beam, Kaufman ion source from Ion Tech Inc. was mounted at a glancing angle of 4 degrees to provide an ion flux over the entire sample surface with an angular spread of about 3 degrees. Any glancing angle and spread that create the desired surface corrugation and smoothing can be used. Different parameters can be used for creation of the corrugation and smoothing and can be determined empirically. Space charge neutral ion beams were obtained by use of a tungsten filament neutralizer. The working pressure for the plasma in the MBE growth chamber was in the range of 1.5 to $5.5 \times 10^{-5}$ Torr. The argon ion beam had a flux density of about $1.6 \times 10^{13}$ ions-cm$^{-2}$-s$^{-1}$ at 60 to 500 eV. Other ion species and flux densities are contemplated and can be determined empirically by one of skill in the art.

The sample surfaces were characterized in situ by reflection high energy electron diffraction (RHEED) at all stages of the growth and other suitable techniques can be used. An Al-coated phosphor screen was used to block the light inside the growth chamber, which allowed recording the RHEED pattern during operation of the Kaufman ion source. The surface morphology measurements were conducted ex situ using tapping mode atomic force microscope (AFM) operated in air.

MOCVD GaN samples were grown on basal plane sapphire substrates by APA Enterprises of Blaine Minn. All surfaces were gallium polar, based on the RHEED pattern. The substrate temperature was measured by a thermocouple pressed against the backside of the sample, and the measured temperature offset to the sample surface was calibrated using desorption mass spectroscopy. Non-contact optical temperature measurement techniques can also be used. A GaN MOCVD sample was divided into 1 cm×1 cm sections and their morphologies compared after different processing steps. The growth rate was about 0.2 ML/s (monolayers/s), limited by the nitrogen flux. Any desired growth rate can be used. The small ion flux changed the growth rate by less than 10%. The starting etch pit densities ranged from $2-6 \times 10^{10}$ cm$^{-2}$.

The density of threading dislocations in the films is represented by the pit density at the surface. After growth, an ammonia anneal at $3 \times 10^{-7}$ Torr, or equivalently an RF plasma with nitrogen, is used as a vacuum etch to reveal the dislocation pits. This compared to the density revealed by molten KOH etching to within 25%. The KOH used in this work is 99.99% pure molten base at temperature of 200 degrees C. The etching rate, 40 nm/min, was measured by a step profiler. During the etching, samples were immersed in molten KOH in a humidity controlled clean hood for about 60 s, corresponding to the removal of about 155 ML of GaN. Residual gallium droplets, if any, were also removed by etching. This amount of etching was insufficient to cause the etch pits to grow enough to coalesce.

A schematic of the dislocation filter structure grown is shown in FIG. 1 for the case of a double stage filter on MOCVD GaN grown on a basal plane sapphire substrate and described in more detail above. Any number of filter stages can be used. Each filter stage contained three main layers: a nanosculpted layer, A, in which the nanoscale features were created, a transition region, B, obtained by ion polishing of the layer A, and a growth layer with a reduced dislocation density. The nanosculpted layer, A, was prepared by MBE growth while simultaneously applying a glancing-angle, Ar ion flux. The layer thickness ranged between 20 and 100 nm and any desired thickness can be used. The Ar ion energy was between 60-500 eV at an ion flux from $1.6-150 \times 10^{13}$ ions-cm$^{-2}$-s$^{-1}$. To obtain the nanoscale, surface corrugation, the sample was not rotated during growth. It is contemplated that very slow rotation can be used as it may provide the same surface corrugation. The feature size of the corrugation was found to increase from 100 to 800 nm depending on ion energy and etch time and so, to some extent, could be matched to the dislocation density. The nanosculpting process was monitored with RHEED to maintain a relatively flat surface. If the surface became too rough, as indicated by the appearance of 3D, transmission features, a smooth surface could not be recovered later. Ion polishing, as described below, was used to control the surface roughness. It was found experimentally that growth of this nanosculpted layer at about 500 degrees C. (about 200 degrees lower than the typical RF-MBE growth in this system) was most effective. The growth rate for this interlayer was 0.05-0.1 ML/s but other growth rates are contemplated. At this generally lower growth temperature, the nanosculpted layer comprises a greater concentration of gallium as compared to the gallium nitride grown at higher temperatures and can be measured and used to identify the nanosculpted layer by techniques know to those in the art. Also, it is believed that a bending of dislocations or ending of dislocation can be seen in this region by transmission electron microscopy.

Figure 2:
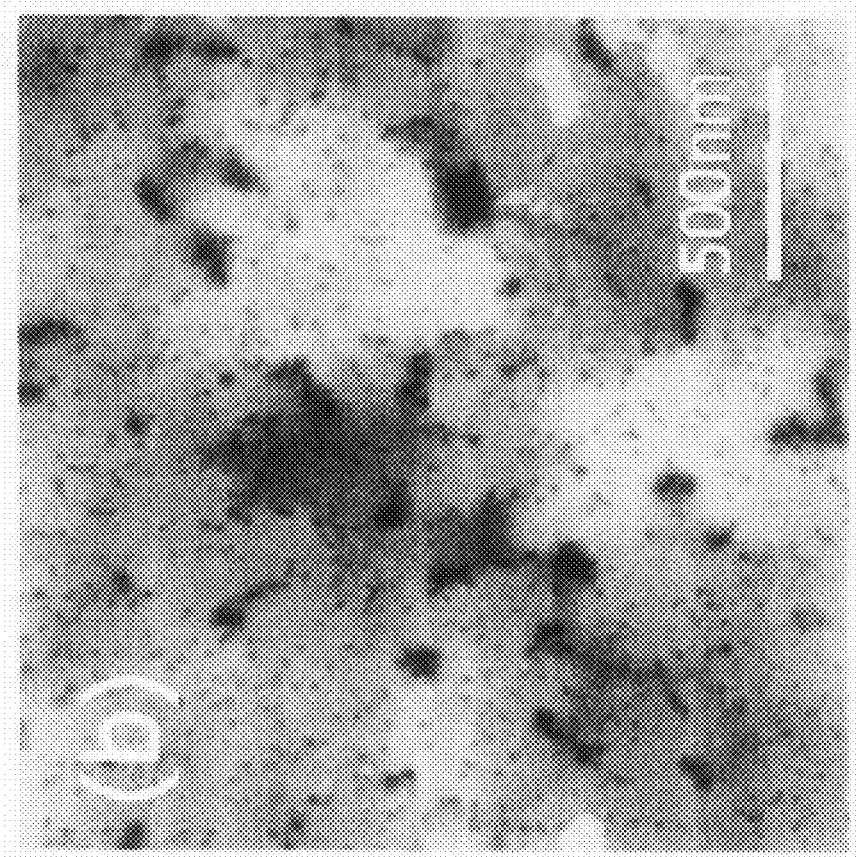
FIG. 2 shows atomic force microscopy (AFM) images showing a comparison of a layer grown with and without the nanosculpting process and provides an evaluation of the effectiveness of the nanosculpted layer in a single-stage dislocation filter. In (a) the nanosculpted region A was formed with the Ar ion beam. In (b) the sample was rotated during ion etching and growth so that the rippled nanostructure was not formed. This micrograph shows the nanosculpted region A without the polished, transition region B in which growth is interrupted. The height range for the AFM was set to 20 nm.
Figure 2:
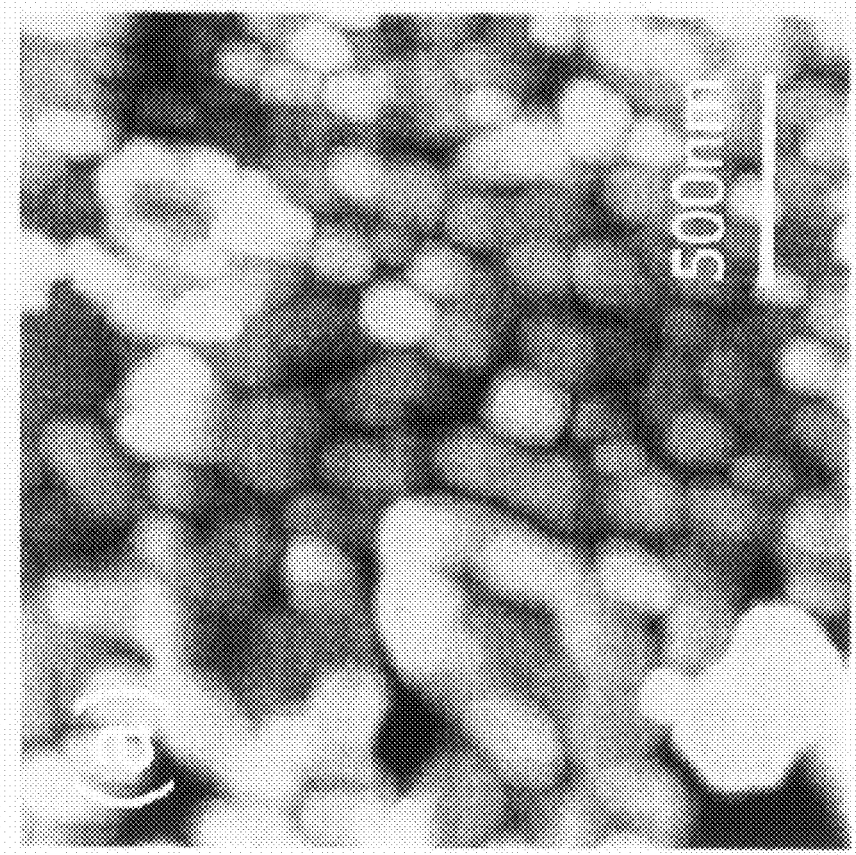

A comparison of a layer grown with and without the nanosculpting process is shown in FIG. 2 which provides an evaluation of the effectiveness of the nanosculpted layer in a single-stage dislocation filter. In (a) the nanosculpted region A was formed with the Ar ion beam. In (b) the sample was rotated during ion etching and growth so that the rippled nanostructure was not formed. This AFM shows the nanosculpted region A without the polished, transition region B in which growth is interrupted. The height range was set to 20 nm.

These AFM images show the surface morphology of an exemplary film structure described in FIG. 1, stopping the process after the growth of the nanosculpted layer, A. In both cases an Ar flux of $1.6 \times 10^{13}$ ions-cm$^{-2}$-s$^{-1}$ for 15 min was used with an ion energy of 100 eV. Any ion species, incidence angle, spread angle, and source, can be used that provides a surface corrugation and/or polishing in accordance with the present invention. In FIG. 2(a) there was no sample rotation during ion assisted growth. In FIG. 2 (b) there was slow rotation at 1.2 rpm, so that no observable corrugation was produced; the RHEED pattern for both showed sharp (1×1) streaks, with the rotation sample's pattern sharper and brighter. Thus this process produces a very thin, laterally patterned surface morphology, overshadowing the pit morphology seen without the nanosculpting treatment.

The polished, transition region, B, is believed critical for reduction of the dislocation density. For this layer, MBE growth was stopped. The same ion beam flux was used as during growth of the nanosculpted layer (other ion beam parameters can be used, however), but now the sample was rotated at a rate of 1.2 rpm. The substrate temperature was held at 500 degrees C. The sample rotation began prior to interruption of the growth flux. Ions then etched the surface for several seconds, not enough to affect smooth regions, until the RHEED patterns reverted to sharp streaky patterns. Sometimes, due to too much excess gallium accumulation (indicated by an increased RHEED diffuse intensity) on the surface, ammonia was used to consume the surface gallium, at 700 degrees C., before restarting the growth of the main layer. It should be noticed that ions can remove gallium droplets too, but the film tends to be degraded by ion bombardment. Although this ion induced film degradation can be recovered by thermal annealing, the thermal annealed interlayer often did not give a large reduction in the dislocation density. Like the nanosculpted region, at this generally lower growth temperature, the polished region comprises a greater concentration of gallium as compared to the gallium nitride grown at higher temperatures and can be measured and used to identify the polished region by techniques know to those in the art. Also, it is believed that a bending of dislocations or ending of dislocation can be seen in this region by transmission electron microscopy.

Figure 3:
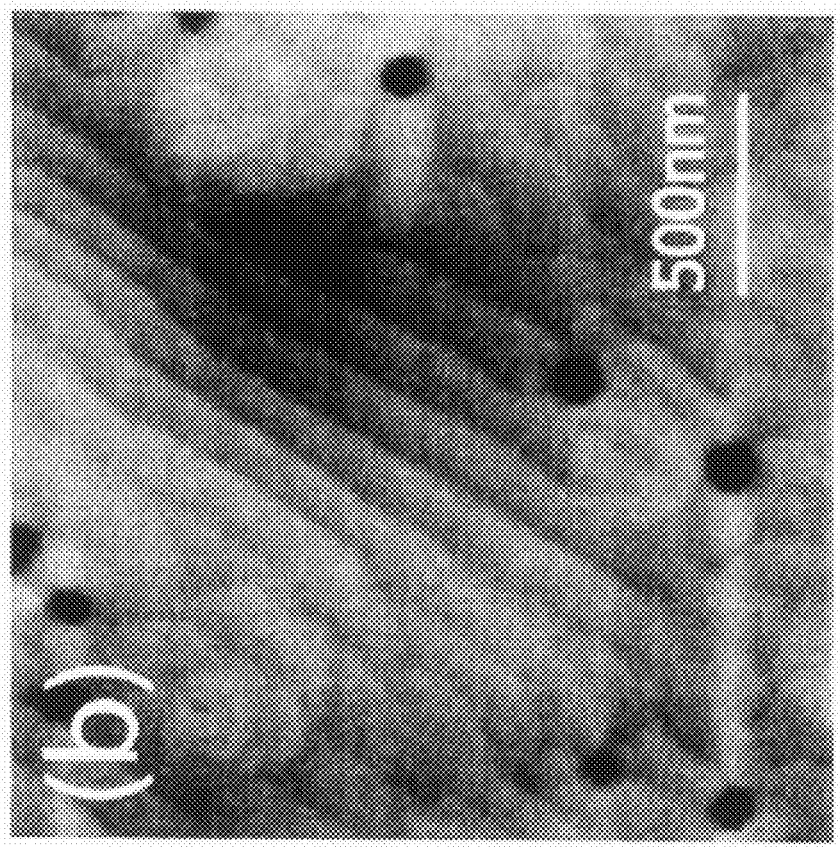
FIG. 3 shows AFM images of (a) the starting MOCVD GaN template and (b) the surface after 200 nm of MBE growth on top of a single stage filter structure. Image (b) corresponds to growth of regions A, B, and C in FIG. 1. The dislocation density was reduced from $2\times10^{10}$ to $2\times10^8$ defects cm$^{-2}$. In a two stage filter the dislocation density was reduced further to $2\times10^7$ defects cm$^{-2}$.
Figure 3:
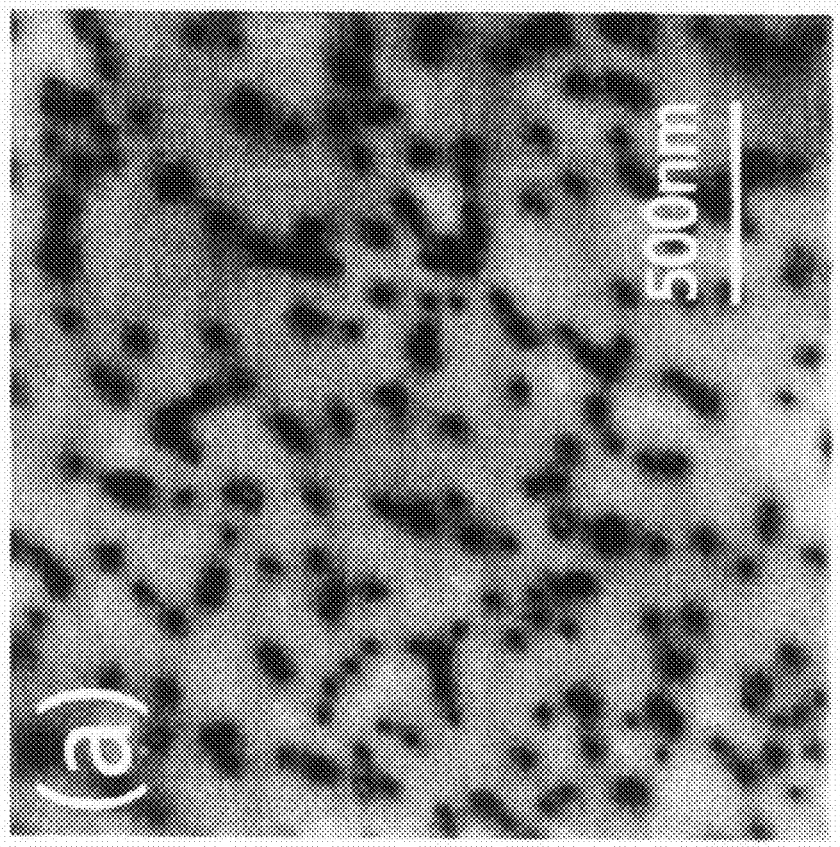

After this final surface planarization, a film was grown at 700 degrees C. For this growth the RF source supplied nitrogen; Gallium was provided by the effusion cell. The film thickness was chosen to be sufficient for unambiguous KOH etching. FIG. 3 shows AFM images of (a) the starting MOCVD GaN template and (b) the surface after 200 nm of MBE growth on top of a single stage filter structure. Image (b) corresponds to growth of regions A, B, and C in FIG. 1. The dislocation density was reduced from $2 \times 10^{10}$ to $2 \times 10^{8}$ cm$^{-2}$. In a two stage filter the dislocation density was reduced further to $2 \times 10^{7}$ cm$^{-2}$.

After the single stage filter, based on a series of 10 μm×10 μm scans, the sum of the pit density and hillock density was $2 \times 10^{8}$ cm$^{-2}$. Typical regions near the sample center are shown. Using a two stage filter, like that illustrated in FIG. 1, the dislocation density was reduced to $2 \times 10^{7}$ cm$^{-2}$. Using additional stages, it is believed that the dislocation density can be reduced to below $1 \times 10^{6}$ cm$^{-2}$.

The present invention has now been described with reference to several embodiments thereof. The entire disclosure of any patent or patent application identified herein is hereby incorporated by reference. The foregoing detailed description and examples have been given for clarity of understanding only. No unnecessary limitations are to be understood therefrom. It will be apparent to those skilled in the art that many changes can be made in the embodiments described without departing from the scope of the invention. Thus, the scope of the present invention should not be limited to the structures described herein, but only by the structures described by the language of the claims and the equivalents of those structures.

REFERENCES

The following references are each incorporated by reference herein in their entirety for all purposes.
1. P. Gibart, Reports on Progress in Physics 67, 667
2. H. Amano, M. Iwaya, T. Kashima, M. Katsuragawa, I. Akasaki, J. Han, S. Hearne, J. A. Floro, E. Chason, and J. Figiel, Jpn. J. Appl. Phys. 37, L1540
3. X. L. Fang, Y. Q. Wang, H. Meidia, and S. Mahajan, Appl. Phys. Lett. 84, 484
4. K. J. Lee, E. H. Shin, and K. Y. Lim, Appl. Phys. Lett. 85, 1502
5. S. Tanaka, M. Takeuchi, and Y. Aoyagi, Jpn. J. Appl. Phys, pt 2 39, 831
6. D. Huang, M. Reshchikov, F. Yun, T. King, A. Baski, and H. Morkoc, Appl. Phys. Lett. 80, 216
7. M. Sumiya, Y. Kurumasa, K. Ohtsuka, K. Kuwahara, Y. Takano, and S. Fuke, J. Cryst. Growth 237-239, 1060
8. K. Jeganathan, M. Shimizu, and H. Okumura, Appl. Phys. Lett. 86, 191908
9. S. Nitta, T. Kashima, R. Nakamura, M. Iwaya, H. Amano, and I. Akasaki, Surf. Review and Lett. 7, 561
10. C. Ashby, C. Willan, J. Han, N. Missert, P. Provencio, D. Follstaedt, G. Peake, and L. Griego, Appl. Phys. Lett. 77, 3233
11. B. Cui, P. I. Cohen, and A. M. Dabiran, J. Appl. Phys. 97, 104313
12. R. L. Headrick, S. Kycia, A. R. Woll, J. D. Brock, and M. V. Ramana Murty, Phys. Rev. B 58, 4818
13. P. M. DeLuca, K. C. Ruthe, and S. A. Barnett, Phys. Rev. Lett. 86, 260
14. R. M. Bradley and J. M. E. Harper, J. Vac. Sci. Technol. A 6, 2390

15. R. M. Bradley, Phys. Rev. E 54, 6149
16. B. Cui, P. I. Cohen, and A. M. Dabiran, J. Appl. Phys. 98, 083504
17. B. Cui and P. I. Cohen, to be submitted to J. Appl. Phys.
18. H. Hansen, C. Polop, T. Michely, A. Friedrich, and H. M. Urbassek, Phys. Rev. Lett. 92, 246106
19. V. Narayanan, K. Lorenz, and S. Mahajan, Phil. Mag. A 82, 885
20. R. Held, G. Nowak, B. E. Ishaug, S. M. Seutter, A. Parkhomovsky, A. M. Dabiran, P. I. Cohen, I. Grzegory, and S. Porowski, J. Appl. Phys., 85, 7697
21. R. Held, D. E. Crawford, A. M. Johnston, A. M. Dabiran, and P. I. Cohen, J. Electron. Mater. 26, 272
22. H. Morkoc, M. A. Reshchikov, K. M. Jones, F. Yun, P. Visconti, M. I. Nathan, and R. J. Molnar, Mat. Res. Soc. Symp. 639, G11.2.1
23. A. Parkhomovsky, A. M. Dabiran, B. Benjaminsson, and P. I. Cohen, Appl. Phys. Lett. 78, 2315
24. P. Visconti, D. Huang, F. Yun, M. Reshchikov, T. King, R. Cingolani, J. Jasinski, Z. Liliental-Weber, and H. Morkoc, Phys. Stat. Sol. A 190, 5
25. A. Ichimiya and P. 1. Cohen (Cambridge University Press, 2004).
26. J. Li, D. Stein, C. McMullan, D. Branton, M. Aziz, and J. Golovchenko, Nature 412, 166

What is claimed is:

1. A method of making a layered thin-film structure, the method comprising the steps of:
   a) providing a substrate having a surface;
   b) epitaxially growing a Group-III nitride material on at least a portion of the surface of the substrate for a growth period while concurrently applying an ion flux at a first glancing angle of incidence during at least a portion of the growth period to provide a nanoscale surface corrugation having a feature size;
   c) after step b) rotationally moving the substrate while applying the ion flux at a second glancing angle of incidence to reduce the feature size of the nanoscale surface corrugation thereby forming a transition region; and
   d) epitaxially growing the Group-III nitride material on at least a portion of the transition region.

2. The method of claim 1, wherein the substrate comprise a Group-III nitride material.

3. The method of claim 1, wherein the substrate comprises one of sapphire, silicon, silicon carbide, germanium, and zinc oxide.

4. The method of claim 1, wherein the Group-III nitride material comprises gallium nitride.

5. The method of claim 1, comprising epitaxially growing the Group-III nitride material by molecular beam epitaxy.

6. The method of claim 1, wherein the glancing first angle of incidence of step b) is different from the second glancing angle of incidence of step c).

7. The method of claim 1, wherein steps b) and c) are performed at a first temperature and step d) is performed at a second temperature greater than the first temperature.

8. The method of claim 7, wherein the first temperature is about five hundred degrees Celsius and the second temperature is about seven hundred degrees Celsius.

9. The method of claim 1, comprising sequentially repeating steps b), c), and d) one or more times, wherein the surface of the substrate recited in step b) is the surface of the Group-III nitride material grown in step d).

10. A method of making a gallium nitride dislocation filtering buffer layer structure, the method comprising the steps of:
    a) creating a nanoscale surface corrugation having a feature size by applying a glancing angle ion flux while concurrently epitaxially growing gallium nitride; and
    b) forming a transition region by reducing the feature size of the nanoscale surface corrugation by applying the glancing angle ion flux.

11. The method of claim 10, further comprising growing gallium nitride on the transition region.

12. The method of claim 10, further comprising providing a substrate.

13. The method of claim 12, wherein the substrate is stationary during step a).

14. The method of claim 13, wherein the substrate is rotationally moving during step b).

* * * * *